United States Patent [19]

Yoshida et al.

[11] Patent Number: 5,444,645
[45] Date of Patent: Aug. 22, 1995

[54] MULTI-CHANNEL PSEUDO RANDOM PATTERN GENERATING DEVICE

[75] Inventors: Tomio Yoshida, Sendai; Kazuhiro Shimawaki, Gyoda, both of Japan

[73] Assignee: Advantest Corporation, Tokyo, Japan

[21] Appl. No.: 137,010

[22] PCT Filed: Feb. 12, 1993

[86] PCT No.: PCT/JP93/00174

§ 371 Date: Oct. 14, 1993

§ 102(e) Date: Oct. 14, 1993

[87] PCT Pub. No.: WO93/16432

PCT Pub. Date: Aug. 19, 1993

[30] Foreign Application Priority Data

Feb. 14, 1992 [JP] Japan .................. 4-027655

[51] Int. Cl.$^6$ ............................................. G06F 1/02
[52] U.S. Cl. ............................................. 364/717
[58] Field of Search ................................. 364/717

[56] References Cited

U.S. PATENT DOCUMENTS

| | | | |
|---|---|---|---|
| 4,649,419 | 3/1987 | Arragon et al. | 364/717 X |
| 5,257,282 | 10/1993 | Adkisson et al. | 364/717 X |
| 5,268,949 | 12/1993 | Watanabe et al. | 364/717 X |
| 5,327,365 | 7/1994 | Fujisaki et al. | 364/717 |

FOREIGN PATENT DOCUMENTS

| | | |
|---|---|---|
| 529512 | 3/1993 | European Pat. Off. |
| 58-4442 | 1/1983 | Japan |
| 63-19038 | 1/1988 | Japan |
| 2-43594 | 2/1990 | Japan |

OTHER PUBLICATIONS

Proceedings of the 1989 Winter Simulation Conference, Washington D.C., pp. 459–461; Fushimi: "Random number generation on parallel processors".

IEE Proceedings E. Computers & Digital Techniques, vol. 138, No. 3, May 1991, Stevenage GB, pp. 138–146, Saarinen et al "VLSI implementation of Tausworthe random number generator for parallel processing environment".

Parallel Computing, vol. 15, No. 1, Sep. 1990, Amsterdam NL, pp. 155–164, Deak, "Uniform random number generators for parallel computers".

*Primary Examiner*—Roy N. Envall, Jr.
*Assistant Examiner*—Chuong D. Ngo
*Attorney, Agent, or Firm*—Staas & Halsey

[57] ABSTRACT

Pseudo random pattern generators ($1_1$ through $1_m$) of respective channels generate pseudo random patterns on the basis of the same n-order generator polynomial. A pseudo random pattern calculating part calculates data $X(t_1), X(t_2), \ldots, X(t_m), \ldots, X(t_{pm})$ that are generated at times $t_1, t_2, \ldots, t_m, \ldots, t_{pm}$ at intervals $z_k$ and loads them as initial values in an initial value table in the case where a pseudo random pattern is generated by a pseudo random pattern generator identical in construction with the pseudo random pattern generator of each channel. Initial value data of one of such p sets of initial values are set in the pseudo random pattern generators ($1_1$ through $1_m$) of the respective channels, after which the generation of a pseudo random pattern is started.

6 Claims, 4 Drawing Sheets

RPG : PSEUDO RANDOM PATTERN GENERATING PART

MULTI-CHANNEL PSEUDO RANDOM PATTERN GENERATING DEVICE

FIELD OF THE PRESENT INVENTION

The present invention relates to a multi-channel pseudo random pattern generating device and, more particularly, to multiplication of the number of channels and standardization of the circuit configuration of pseudo random pattern generators in respective channels.

BACKGROUND OF THE RELATED ART

The basic circuit of a pseudo random pattern generator (hereinafter referred to simply as a RP generator as well) is made up of a shift register and at least one XOR (an exclusive OR circuit). FIG. 4 is a diagrammatic showing of its example, in which a generator polynomial (or generating function) is expressed by $F(X) = X^5 + X^2 + 1$ and five D-FF (D type flip-flop) stages and one XOR are employed. As shown, for the generation of a pseudo random pattern (PRBS: Pseudo Random Binary Sequence) a feedback type shift register is used and, for example, the outputs from its final stage and any one of its intermediate stages are input into the XOR, whose output is fed back to the input of the shift register. Upon each input of one clock pulse (CK) into this circuit, PRBS data of one or more bits is produced from an arbitrary one or more shift stages.

As is well-known in the art, the pseudo random pattern generator having an n-order generator polynomial F(X) is usually formed by an n-stage shift register type circuit and PRBS data from each shift stage is a repetition of a pattern of successive $2^n - 1$ bits. The outputs from any shift stages have patterns of the same sequence and they are displaced apart in phase alone. Hence, the output from any shift stage may be used as the PRBS data from the pseudo random pattern generator. It is also possible to use outputs from an arbitrary number of shift stages as random pattern data.

As depicted in FIG. 5, a conventional m-channel pseudo random pattern generating device is comprised of RP generators $1_1$ through $1_m$ that have different generator polynomials $F_1(X), F_2(X), ..., F_m(X)$, respectively. Since the generator polynomials $F_i(X)$ (where $i = 1$ through m) differ from one another, cross-correlation of the PRBS data in the respective channels $CH_i$ can be made low.

There is the possibility that as the number m of channels used increases (more than 100, for instance), conventional multi-channel PRBS generating devices could not be implemented because the number of existing generator polynomials $F_i(X)$ is about 100. Moreover, the RP generator in each channel is formed on the basis of a different generator polynomial, and hence has a different circuit configuration accordingly; thus, it is impossible to standardize the circuit configuration of the RP generators in the respective channels and difficult to fabricate them as IC's.

SUMMARY OF THE INVENTION

It is therefore an object of the present invention to solve the defects of the prior art and provide a multi-channel PRBS generating device which allows the number m of channels to be made larger than in the prior art and permits the use of a common circuit configuration for RP generators in respective channels.

The multi-channel PRBS generating device according to the present invention includes pseudo random pattern generators of first to m-th (where m is an integer equal to or larger than 2) channels each formed by an n-stage shift register which is initialized and driven by a clock signal to shift from one stage to another to generate a pseudo random pattern on the basis of a common generator polynomial;

initial value generating means which generates a desired one of first to p-th (where p is an integer greater than 1) sets of initial values $\{I_1, I_2, \ldots, I_m\}$, $\{I_{m+1}, I_{m+2}, \ldots, I_{m+m}\}$, ..., and $\{I_{(p-1)m+1}, I_{(p-1)m+2}, \ldots, I_{(p-1)m+m}\}$ which are obtained by repeatedly generating m times data of n bits that are provided from n shift stages of one of the pseudo random pattern generators at time intervals $z_k$ defined by the number of clock pulses of the clock signal; and a control part which sets the m initial values from the initial value generating means in the pseudo random pattern generators of the m channels to control them to start and stop their operation. In the present invention wherein the time interval $z_k$ is selected sufficiently longer than the time that is actually consumed for pattern generation and, letting the clock cycle of the clock signal be represented by Tc, the number n of shift stages of the pseudo random pattern generator of each channel is so selected as to satisfy $n > \log_2[\{\Sigma z_k / Tc\} + 1]$ where k is from 1 to mp−1.

The above-mentioned initial values may be obtained from an initial value table or through calculations by an initial value calculation part. Alternatively, the initial values may be generated by use of a pseudo random pattern generator of the same construction of that of the pseudo random pattern generator of each channel. In the latter case, the frequency of the clock pulses that are applied to the pseudo random pattern generator for generating the initial values is selected sufficiently higher than the frequency of the clock pulses that are fed to the pseudo random pattern generator of each channel.

DESCRIPTION OF THE PREFERRED EMBODIMENTS

According to the purpose of use, the PRBS is preselected to have a pattern sequence and a repetition period such that the auto-correlation value within the practical operating time becomes smaller than a practically permissible value. For example, in the case of driving a pseudo random pattern generator having 61 shift stages by a 19.44 MHz clock signal, the PRBS pattern length is about $2.3 \times 10^{10}$-bit and the repetition period is as long as 3000 years or more. In the case of a multi-channel PRBS generating device, it is necessary that cross-correlation values of the PRBS data of all channels that are generated become smaller than a permissible value. Incidentally, where PRBS's of the same pattern are generated in two channels at a time interval t, the cross-correlation value becomes equal to the auto-correlation value the time t away in the same PRBS data. It does not matter, in practice, to use the same pattern in the PRBS's of all channels as long as the cross-correlation value is smaller than the auto-correlation value.

Hence, one possible method to get around this problem is to generate PRBS's of the same pattern at sufficiently long time intervals in the respective channels so that the cross-correlation would not matter, in practice, within the practical operating time. Yet this method is not practical, because the time from the start of PRBS generation in one channel to that in the next channel is far longer than the actual operating time.

The present invention implements, by two methods, the multi-channel PRBS generation that satisfies the above-mentioned requirement. A first method is based on a finding that a pattern, which is generated after the elapse of time t that satisfies the above-said condition, can be preobtained by calculation. According to this method, status values of the shift register of the pseudo random pattern generator after the elapse of time intervals $t_1$, $t_2$, ... are precalculated and the values thus obtained are set as initial values in the pseudo random pattern generators of respective channels, after which the generation of the PRBS data is started.

According to the other method, one pseudo random pattern generator is operated on a high-speed clock to generate sequentially status values corresponding to the above-mentioned time intervals $t_1$, $t_2$, ... within a period of time sufficiently shorter than the practical operating time. These status values are set as initial values in the pseudo random pattern generators of the respective channels. The PRBS generation is then started using an ordinary clock signal.

Figure 4:
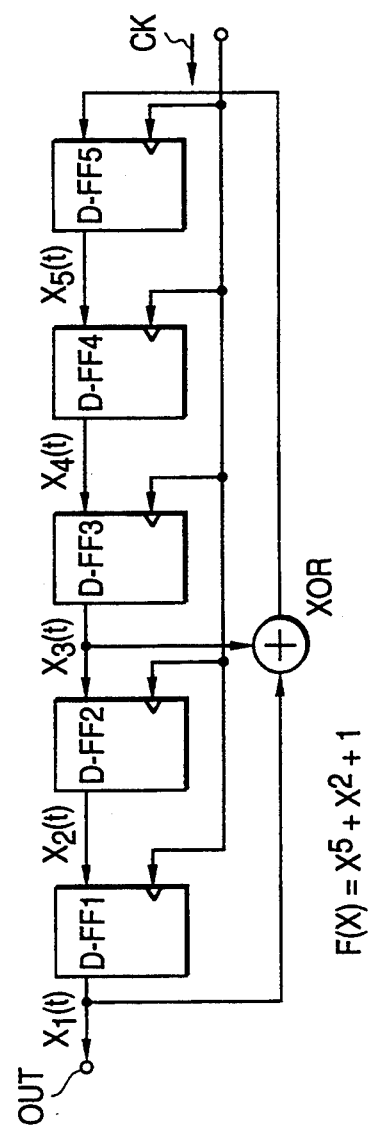
FIG. 4 is a circuit diagram illustrating an example of a pseudo random pattern generator which has a generator polynomial $F(X) = X^5 + X^2 + 1$ and generates PRBS data.

A description will be given first, with reference to FIG. 4, of a method of calculating the shift register status values after certain elapsed time according to the above-noted first method. Letting the outputs from the D-FF's of the respective shift stages at time t be represented by $X_1(t)$, $X_2(t)$, $X_3(t)$, $X_4(t)$ and $X_5(t)$, respectively, the D-FFs' outputs at time $t+1$ after the elapse of one clock time are expressed by Eq. (1).

$$\begin{aligned} X_1(t+1) &= X_2(t), \\ X_2(t+1) &= X_3(t), \\ X_3(t+1) &= X_4(t), \\ X_4(t+1) &= X_5(t), \\ X_5(t+1) &= X_1(t), \\ X_5(t+1) &= X_1(t) + X_3(t) \end{aligned} \tag{1}$$

In the above, the add operation of $X_1(t)$ and $X_3(t)$ at the fifth line in Eq. (1) is a modulo-2 add operation (i.e. an exclusive OR). Expressing the above equation in a matrix form, we have $$\begin{bmatrix} X_1(t+1) \\ X_2(t+1) \\ X_3(t+1) \\ X_4(t+1) \\ X_5(t+1) \end{bmatrix} = A \begin{bmatrix} X_1(t) \\ X_2(t) \\ X_3(t) \\ X_4(t) \\ X_5(t) \end{bmatrix} \tag{2}$$

Here, A becomes Eq. (3).

$$A = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 1 & 0 & 0 \end{bmatrix} \tag{3}$$

Since the outputs from the respective shift stages at time $t+2$ are $$\begin{bmatrix} X_1(t+2) \\ X_2(t+2) \\ X_3(t+2) \\ X_4(t+2) \\ X_5(t+2) \end{bmatrix} = A \begin{bmatrix} X_1(t+1) \\ X_2(t+1) \\ X_3(t+1) \\ X_4(t+1) \\ X_5(t+1) \end{bmatrix} = A^2 \begin{bmatrix} X_1(t) \\ X_2(t) \\ X_3(t) \\ X_4(t) \\ X_5(t) \end{bmatrix} \tag{4}$$

the outputs from the respective shift stages at time $t+z_k$ (i.e. $z_k$ clocks after time t) are found by Eq. (5).

$$\begin{bmatrix} X_1(t+z_k) \\ X_2(t+z_k) \\ X_3(t+z_k) \\ X_4(t+z_k) \\ X_5(t+z_k) \end{bmatrix} = A^{z_k} \begin{bmatrix} X_1(t) \\ X_2(t) \\ X_3(t) \\ X_4(t) \\ X_5(t) \end{bmatrix} \tag{5}$$

Eq. (5) provides the outputs from all shift stages, i.e. the internal data of the shift register (hereinafter referred to as a status value), an arbitrary clock time $z_k$ after time t. Thus, the PRBS data after the arbitrary clock time $z_k$ can be obtained by calculation.

Figure 1A:
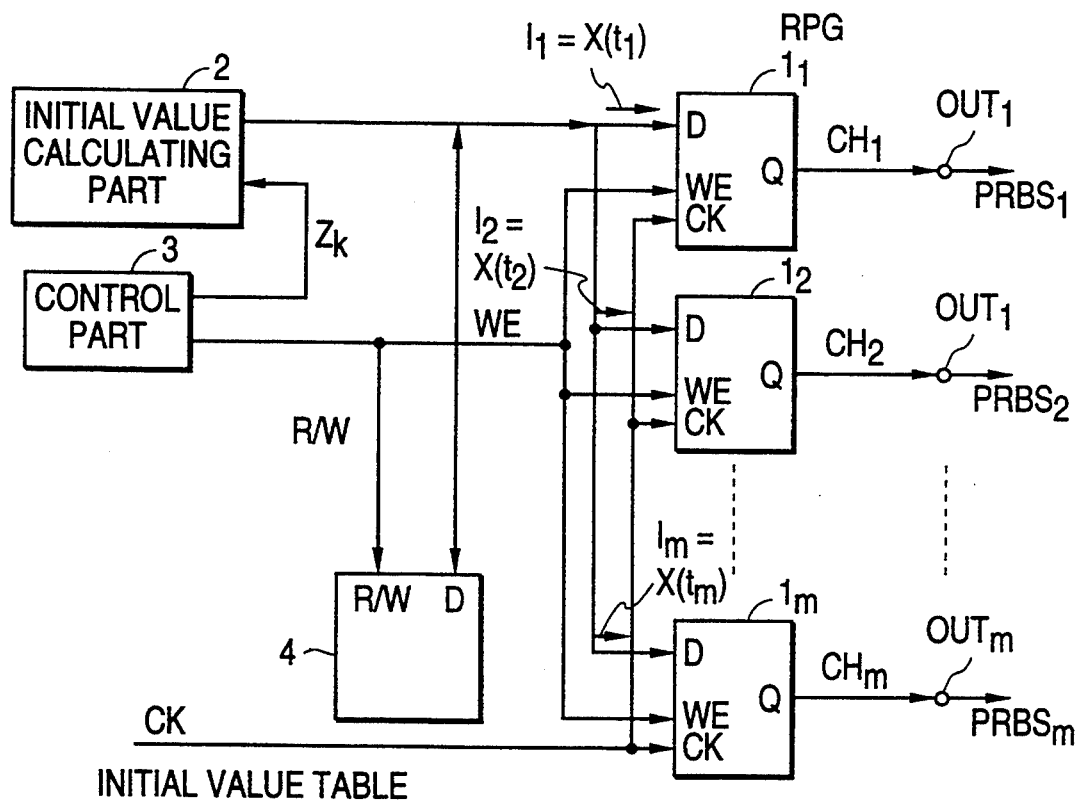
FIG. 1A is a block diagram illustrating an embodiment of the present invention.

Referring now to FIG. 1, an embodiment of the present invention is described. In this embodiment an initial value calculation part 2 sequentially calculates status values that the shift register of the pseudo random pattern generator will reach at time intervals $z_k$ specified by a control part 3, obtains p sets of initial values, each composed of m status values as initial values for RP generators $1_1$ through $1_m$ of m channels $CH_1$ through $CH_m$, and stores them in an initial value table 4 under control of the control part 3. The RP generators $1_1$ to $1_m$ of the m channels are identical in construction, and hence have shift registers of the same number of shift stages.

To generate PRBS data, a desired one of the sets of initial values is read out of the initial value table 4 and the initial values thus read out are set in the shift registers in the RP generators $1_1$ through $1_m$, respectively. Supplied with the shift clock CK, the RP generators $1_1$ through $1_m$ each sequentially output a predetermined one or more shift stages. By reading out another selected set of initial values from the initial value table 4 and set them in the RP generators $1_1$ through $1_m$ as required, the sequence of the PRBS data that is generated could be changed.

Now, consider that the PRBS data is generated by a pseudo random pattern generator identical in construction with the pseudo random pattern (formed by n D-FF stages) of each channel that has an n-order generator polynomial F(X). Based on a status value $X(t_1)$ (hereinafter referred to as a first initial value) of n bits which are data $X_1$ through $X_n$ from n shift stages at an arbitrary time $t_1$, the initial value calculation part 2 calculates a status value $X(t_2)$ (hereinafter referred to as a second initial value) after the elapse of an arbitrary time $z_1$, using the following equation as in the case of Eq. (5).

$$[X(t_2)] = [X(t_1 + z_1)] = A^{z_1} [X(t_1)] \quad (6)$$
$$t_2 = t_1 + z_1$$

In the above, [] represents a matrix and A is also represented by a matrix.

Next, an n-bit status value $X(t_3)$ (hereinafter referred to as a third initial value) time $z_2$ after time $t_2$ is calculated by the following equation:

$$[X(t_3)] = [X(t_2 + z_2)] = A^{z_2} [X(t_2)] \quad (6)$$
$$t_3 = t_2 + z_2$$

Similarly, a status value $X(t_m)$ time $z_{m-1}$ after time $(t_{m-1})$ (an m-th initial value) is obtained by the following equation:

$$[X(t_m)] = [X(t_{m-1} + z_{m-1})] \quad (8)$$
$$= A^{z_{m-1}} [X(t_{m-1})]$$
$$t_m = t_{m-1} + z_{m-1}$$

Figure 1B:
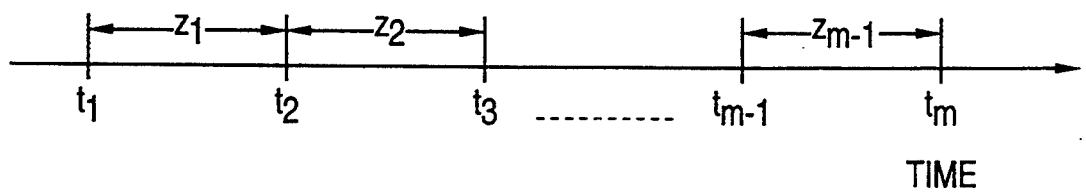
FIG. 1B is a diagram showing the timing of generation of initial values on the assumption that the initial values, which are computed in an initial value computation part 2 in FIG. 1A and set in pseudo random pattern generators of respective channels, are produced by a pseudo random pattern generator identical in construction with those of the respective channels.

In this way, a first set (a first group) of initial values $\{X(t_1), X(t_2), \ldots, X(t_m)\}$ for pseudo random patterns of m channels are calculated (see FIG. 1B). Incidentally, the i-th initial value $X(t_i)$ will be identified by $I_i$ as well, for the sake of simplicity.

In a likewise manner, a second set of m initial values $\{X(t_{m+1}), X(t_{m+2}), \ldots, X(t_{m+m})\}$ are calculated, and a p-th (where p is an integer equal to or greater than 1) set of m initial values $\{X(t_{(p-1)m+1}), X(t_{(p-1)m+2}), \ldots, X(t_{(p-1)m+m})\}$ are similarly calculated. The first to p-th sets of initial values thus obtained are sequentially written into the initial value table 4.

In the case of simultaneously generating PRBS data in all channels, the first to m-th initial values of that one of the plurality of initial values stored in the initial value table 4 which is specified by the control part, for example, the initial values of the first set $X(t_1), X(t_2), \ldots, X(t_m)$ are set in the RP generators $1_1$ through $1_m$, respectively, and they simultaneously start the PRBS generating operation at the timing specified by the control part 3. The status values of the m RP generators after the elapse of time t are $X(t_1+t), X(t_2+t), \ldots, X(t_m+t)$, respectively. Since data from a predetermined one or more of the n shift stages of the RP generator of each channel are output as the PRBS data, the signs $X(t_1+t), X(t_2+t), \ldots, X(t_m+t)$ that represent these status values will hereinafter be used to indicate the PRBS data that are generated in the respective channels after the elapse of time t.

The cross-correlation function of the output PRBS data $X(t_i+t)$ from the RP generator $1_i$ corresponding to the output PRBS data $X(t_j+t)$ from the RP generator $1_j$ becomes equal to the auto-correlation function of the PRBS data $X(t_j+t)$, with a time difference (a phase difference) $t_j - t_i = \Sigma z_k$ (where $k=i$ to $j$) between them. This will be described below.

The auto-correlation represents the general dependency of the value of data X at a certain time on the value of data at a different time. The auto-correlation function $R_X(\tau)$ of data X(t) at times t and $t+\tau$ is obtained by multiplying the values at the two times and averaging the product for an observation time T.

$$R_X(\tau) = \lim_{T=\infty} \frac{1}{T} \int_0^T X(t)X(t + \tau)dt \quad (9)$$

Figure 2:
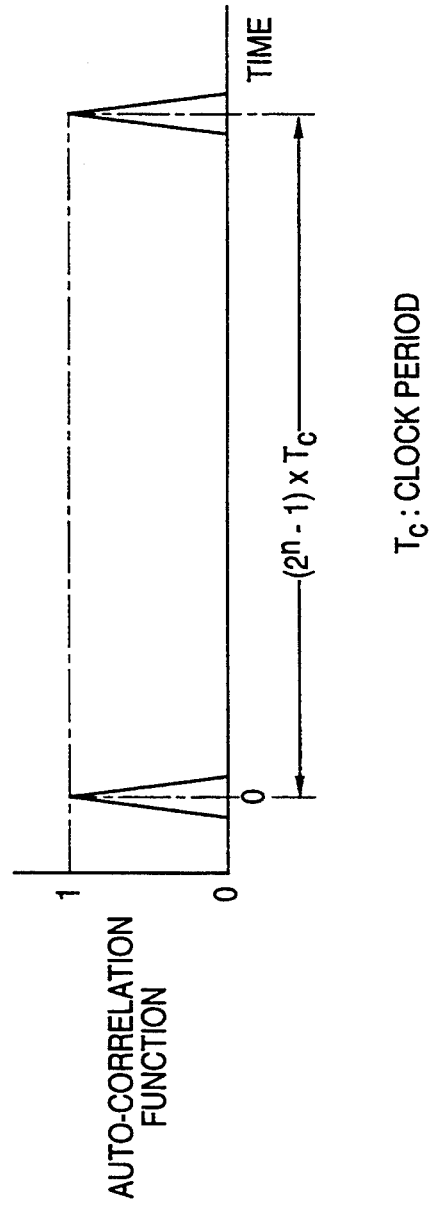
FIG. 2 is a diagram showing how the auto-correlation function of PRBS data available from the pseudo random pattern generator of each channel in FIG. 1A varies with time $\tau$.

Letting the number of shift stages of the shift register forming each RP generator and the shift clock period be represented by n and Tc, respectively, the PRBS data generally has a period of $(2^n-1)Tc$ and the auto-correlation function $R_X(\tau)$ in this case can be expressed by such a graphic representation as shown in FIG. 2. Consequently, the auto-correlation function $R_X(\tau)$ of the PRBS data is 1 only when $\tau$ is an integral multiple of $(2^n-1)$ and it is substantially 0 in other cases.

The cross-correlation represents the general dependency of the value of data X(t) at a certain time on the value of another data Y(t) at a certain time, and the cross-correlation function $R_{XY}(\tau)$ is an average of the product of the value of data X(t) at time t and the value of data Y(t) at time $t+\tau$.

$$R_{XY}(\tau) = \lim_{T=\infty} \frac{1}{T} \int_0^T X(t)Y(t + \tau)dt \quad (10)$$

The cross-correlation function $R_{XY}(\tau)$ between PRBS data X(t) and $X(t+t_a)=Y(t)$ that have a time difference $t_a$ therebetween is given as follows, by substituting $X(t+t_a+\tau)$ for $Y(t+\tau)$ in Eq. (10).

$$R_{XY}(\tau) = \lim_{T=\infty} \frac{1}{T} \int_0^T X(t)Y(t + \tau + t)dt \quad (11)$$

The cross-correlation function $R_{XY}(\tau)$ of Eq. (11) is equal to the auto-correlation function $R_X(\tau)$ of Eq. (9) in the case where $\tau$ is replaced with $\tau+t_a$. This indicates that the cross-correlation between the PRBS data X(t) and $Y(t)=X(t+t_a)$ has the same value as that of the auto-correlation function of the data X(t), with the time difference $t_a$ between them. Hence, as described previously, it can be said that the cross-correlation function between PRBS data $X(t_i+t)$ that is output from the RP generator $1_i$ and PRBS data $X(t_j+t)$ that is output from the RP generator $1_j$ is equal to the auto-correlation function of the data $X(t_j+t)$, with a time difference $t_j - t_i = \Sigma z_k$ (where k is i through j) corresponding to the time difference $t_a$ in Eq. (11).

The value of the auto-correlation function of PRBS data having the generator polynomial F(X) is so small within the period that it does not matter in practice, as is well-known in the art. Also in the cross correlation of PRBS data in two channels (adjacent channels $CH_i$ and $CH_{i+1}$, for example) that have a minimum phase difference between them, if the minimum value $z_k$ of the time difference $t_a$ or $t_{i+1} - t_i$ is selected sufficiently larger (100 times or so, for example) than the actual operating time of the PRBS generator and smaller than $(2^n - 1)/Tc/mp$, the cross-correlation function $R_{XY}(\tau)$ of PRBS data in the respective channels will not become equal to the auto-correlation function $R_X(\tau)$ in the actual operating state. Thus, the phase difference (time difference) $z_k$ between initial values can be freely selected within such a range. Furthermore, since the cross-correlation function $R_{XY}(\tau)$ is a function that can be obtained simply by replacing the time $\tau$ of the auto-correlation function $R_X(\tau)$ with $\tau + t_a$, the value of the cross-correlation function of the PRBS data in respective channels is also so small that it does not matter in practice.

Letting the output continuation time of the multi-channel PRBS generating device be represented by $T_M$, the time difference (or phase difference) $z_k$ of the initial values is set to the following value, for example, for the reasons given above.

$$z_k \geq 100 \times T_M \qquad (12)$$

Now, let the order of the generator polynomial F(X) and consequently the number of stages of the shift register of the pseudo random pattern generator be represented by n. In order that each RP generator $1_i$ may keep randomness, it is necessary that the period $(2^n - 1) \times Tc$ (where Tc is the clock period) of PRBS data that the random generator generates be longer than the time $\Sigma z_k$ (where k is 1 through mp-1) that would be consumed if p sets of initial values stored in the initial value table 4 are sequentially generated by the same RP generator $1_i$. Therefore, $$(2^n - 1)Tc > \Sigma z_k, \text{ where } k \text{ is 1 through } mp - 1. \qquad (13)$$
$$2^n > \{\Sigma z_k/Tc\} + 1 \qquad (14)$$

Taking logarithms of the both sides of Eq. (14), the following equation is given:

$$n > \log_2[\{\Sigma z_k/Tc\} + 1] \qquad (15)$$

For instance, in the case where the clock period $Tc = 3$ $\mu s$, the PRBS generating device operating time $T_M = 36000$ s ($= 100$ hours), the number m of channels $= 40$ and the number p of initial values set $= 16$ are employed, the number n of stages of the pseudo random pattern generator is larger than 50.

While in the above the initial values stored in the initial value table 4 are set in the RP generators $1_i$ of m channels, it is also possible in some cases that the initial values computed in the initial value calculating part are sequentially written into the RP generators $1_1$ through $1_m$ at the same time they are loaded into the initial value table 4.

The RP generators $1_1$ through $1_m$ have the same generator polynomial and, of course, they are exactly identical in circuit construction. The output from the random pattern generating device may be obtained from any one or more shift stages.

Figure 3:
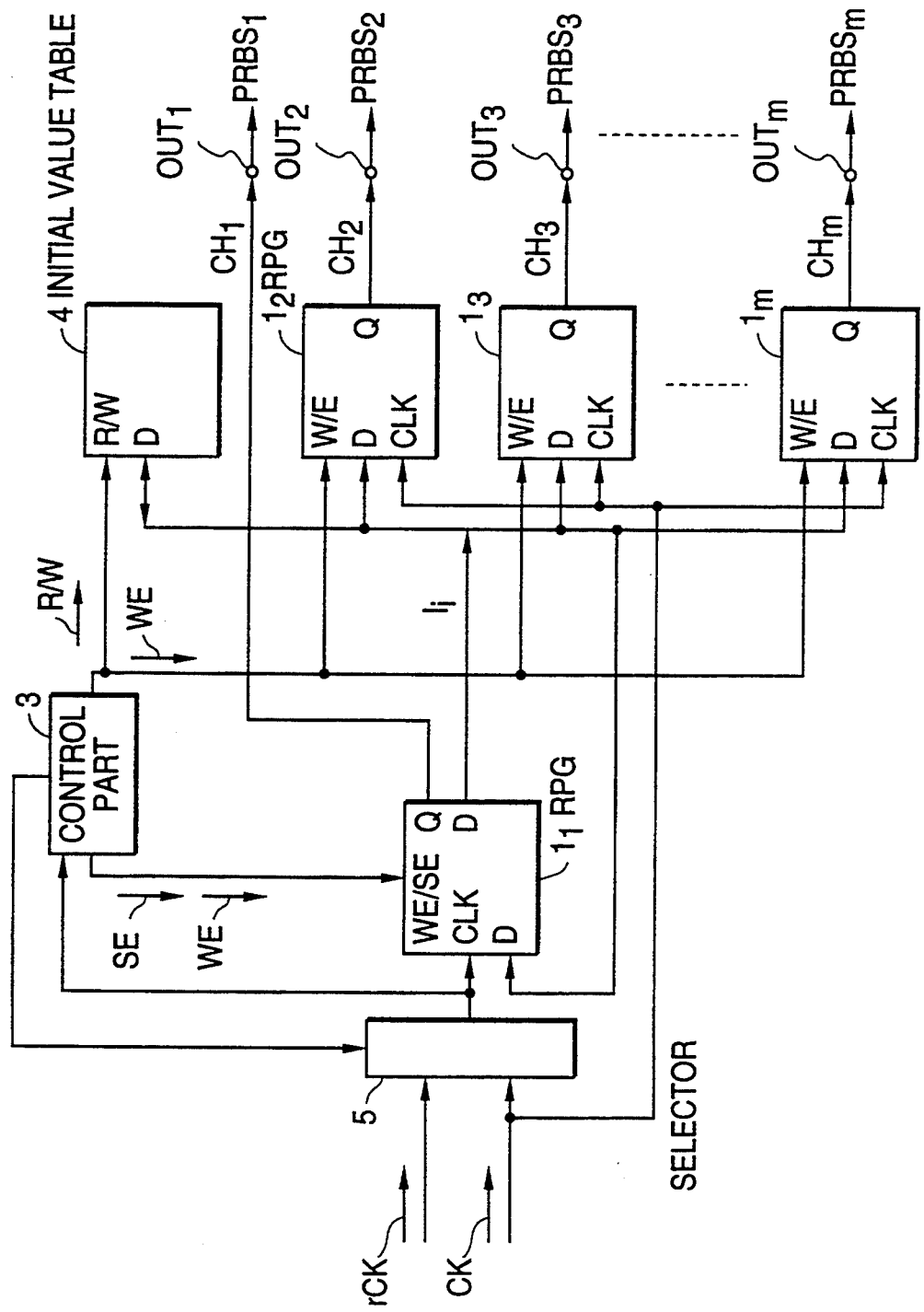
FIG. 3 is a block diagram illustrating another embodiment of the present invention.
Figure 5:
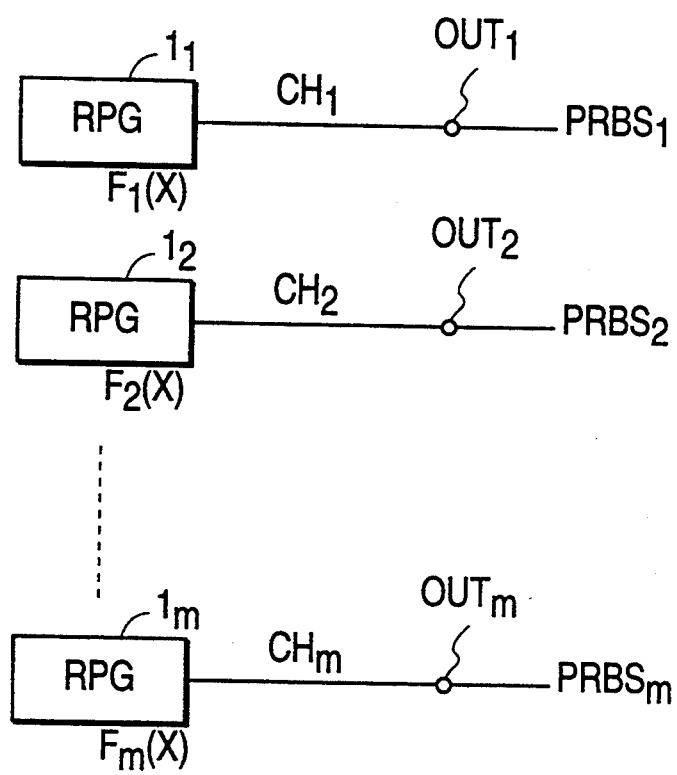
FIG. 5 is a block diagram showing a conventional multi-channel pseudo random pattern generating device.

FIG. 3 illustrates another embodiment of the present invention which utilizes the afore-mentioned second method and in which the initial value calculating part 2 is not used but instead a pseudo random pattern generator identical in construction with the RP generator $1_i$ of each channel is operated and status values that are generated by the random pattern generator at times $t_1, t_2, \ldots, t_m, t_{m+1}, \ldots, t_{pm}$ (the time interval $z_k$) are written into the initial value table 4 as initial values of p sets. In this embodiment, however, the RP generator $1_1$, which forms one of the channels $CH_1$ through $CH_m$, is used as the pseudo random pattern generator for generating the initial values, and a selector 5 responds to a select signal from the control part 3 to supply the RP generator $1_1$ with either one of a normal clock CK and a fast clock rCK of a frequency t times higher than the clock CK.

In the case of generating initial values of p sets, the fast clock rCK is selected by the selector 5 and applied to the RP generator $1_1$, from which the initial values of the p sets are sequentially generated within a period of time sufficiently shorter than the actual operating time of the device. The control part 3 has a high-speed counter (not shown) and provides a write instruction to the initial table 4 each time the count value of the counter reaches a predetermined clock time. In the case of generating PRBS data, initial values of a desired set are read out from the initial value table 4 and are set in the RP generators $1_1$ through $1_m$, and the normal clock CK is fed via the selector 5 to the RP generator $1_1$ and to the other RP generators $1_2$ to $1_m$ as well, thus starting the PRBS generation. With the use of the fast clock rCK, the time for generating the initial values can be reduced down to 1/r.

In the FIG. 3 embodiment the initial values from the RP generator $1_i$ may also be set directly in the other RP generators $1_2$ through $1_m$ without using the initial value table 4. In such an instance, m-1 initial values are sequentially set in the RP generators $1_2$ through $1_m$ in the order of generation and the supply of the fast clock rCK is stopped in the state in which the m-th initial value is generated. When the RP generator $1_1$ is used only to generate initial values in the FIG. 1 embodiment, another channel pseudo random pattern generator is required but the selector 5 is not necessary and the fast clock rCK is provided directly to the initial value generating RP generator $1_1$.

As described above, according to the present invention, since the relationship of Eq. (15) holds true between the number m of PRBS generating channels and the number n of stages of the shift register of each of the RP generators of respective channels that have the same generator polynomial F(X), the number m of channels can be increased, as required, by increasing the number m of stages of the shift registers.

Moreover, since the RP generators of respective channels have the same generator polynomial F(X) and hence are identical in circuit configuration, they can be designed and manufactured more easily than in the prior art using different generator polynomials for respective channels, are suitable for fabrication as an IC.

What is claimed is:

1. A multi-channel pseudo random pattern generating device including a clock signal having clock pulses and a clock period, said multi-channel pseudo random pattern generating device comprising:

pseudo random pattern generators comprising first to m-th channels, each channel comprising an exclusive OR circuit and an n-stage shift register to have a common generator polynomial and initialized and driven by the clock signal to shift from one stage to another stage and generating a pseudo random pattern based on the common generator polynomial, said m being an integer equal to or greater than 2;

initial value generating means for generating first to p-th sets of initial values $\{I_1, I_2, \ldots, I_m\}$, $\{I_{m+1}, I_{m+2}, \ldots, I_{m+m}\}, \ldots$, and $\{I_{(p-1)m+1}, I_{(p-1)m+2}, \ldots, I_{(p-1)m+m}\}$ identical to initial values obtained by repeatedly generating m times, for each set, data of n bits from n shift stages of one of said pseudo random pattern generators at time intervals $z_k$ defined by a number of the clock pulses;

memory means for storing said first to p-th sets of the initial values in a table; and control means for reading m initial values of a selected set from said memory means, setting the initial values into said pseudo random pattern generators of said m channels and controlling said pseudo random pattern generators to start and stop their respective operations, wherein said time interval $z_k$ is longer than an actual pattern generating time and, representing the clock period of said clock signal by Tc, a number n of said shift stages of said pseudo random pattern generator of each channel satisfying $$n > \log_2(\{\Sigma z_k / Tc\} + 1),$$

where k=1 through mp-1.

2. The multi-channel pseudo random pattern generating device according to claim 1, wherein said initial value generating means comprises initial value calculating means for generating at least one of said p sets of initial values through calculation.

3. The multi-channel pseudo random pattern generating device according to claim 2, wherein said initial value calculating means generates said p sets of initial values through calculation.

4. The multi-channel pseudo random pattern generating device according to claim 1, wherein said initial value generating means comprises select means for selecting one of said clock signal and said fast clock and one of said pseudo random pattern generators of said m channels, and when said at least one set of initial values are generated, said control means provides said fast clock via said select means to said one pseudo random pattern generator, and sets in said pseudo random pattern generators of said m channels said one set of pattern generator, and when a pseudo random pattern is generated, said control means provides said clock signal via said select means to said pseudo random pattern generators of said m channels.

5. A multi-channel pseudo random pattern generating device including a clock signal having clock pulses and a clock period, said multi-channel pseudo random pattern generating device comprising:

pseudo random pattern generators comprising first to m-th channels, each channel comprising an exclusive OR circuit and an n-stage shift register to have a common generator polynomial and initialized and driven by the clock signal to shift from one stage to another stage and generating a pseudo random pattern based on the common generator polynomial, said m being an integer equal to or greater than 2;

initial value generating means, comprising high-speed pseudo random pattern generating means identical in construction to one of said pseudo random pattern generators and driven by a second clock signal having a second frequency higher than a frequency of the clock signal, for generating first to p-th sets of initial values $\{I_1, I_2, \ldots, I_m\}$, $\{I_{m+1}, I_{m+2}, \ldots, I_{m+m}\}, \ldots$, and $\{I_{(p-1)m+1}, I_{p-1)m+2}, \ldots, I_{p-1)m+m}\}$ identical to initial values obtained by repeatedly generating m times, for each set, data of n bits from n shift stages of one of said pseudo random pattern generators at time intervals $z_k$ defined by a number of the clock pulses;

memory means for storing said first to p-th sets of the initial values in a table; and control means for reading m initial values of a selected set from said memory means, setting the initial values into said pseudo random pattern generators of said m channels and controlling said pseudo random pattern generators to start and stop their respective operations, wherein said time interval $z_k$ is longer than an actual pattern generating time and, representing the clock period of said clock signal by Tc, a number n of said shift stages of said pseudo random pattern generator of each channel satisfying $$n > \log_2(\{\Sigma z_k / Tc\} + 1),$$

where k=1 through mp-1.

6. The multi-channel pseudo random pattern generating device according to claim 5, wherein said high-speed pseudo random pattern generating means generates said p sets of initial values, said initial value generating means comprises memory means for storing said p sets of initial values generated by said high-speed pseudo random pattern generating means, and said control means reads out a selected one set of initial values from said memory means and sets them in said pseudo random pattern generating means of said m channels.

* * * * *

UNITED STATES PATENT AND TRADEMARK OFFICE
CERTIFICATE OF CORRECTION

PATENT NO. : 5,444,645
DATED : August 22, 1995
INVENTOR(S) : Yoshida et al.

It is certified that error appears in the above-indentified patent and that said Letters Patent is hereby corrected as shown below:

Col. 2, line 22, after "invention" insert --,--;
    line 23, delete "wherein".
Col. 5, line 32, change "(6)" to --(7)--.
Col. 10, line 21, in the formula (second occurrence), after "I" and before "$_p$" insert --(--;
    line 22, after "I" and before "$_p$" insert --(--.

Signed and Sealed this

Twenty-eighth Day of November 1995

Attest:

BRUCE LEHMAN

*Attesting Officer*    *Commissioner of Patents and Trademarks*